United States Patent [19]
Miyafuji et al.

[11] Patent Number: 4,822,562
[45] Date of Patent: Apr. 18, 1989

[54] COPPER ALLOY EXCELLENT IN MIGRATION RESISTANCE

[75] Inventors: Motohisa Miyafuji; Isao Hosokawa, both of Yamaguchi, Japan

[73] Assignee: Kabushiki Kaisha Kobe Seiko Sho, Kobe, Japan

[21] Appl. No.: 930,114

[22] Filed: Nov. 13, 1986

[30] Foreign Application Priority Data

Nov. 13, 1985 [JP] Japan ................................. 60-254358
Dec. 9, 1985 [JP] Japan ................................. 60-276233

[51] Int. Cl.$^4$ .............................................. C22C 9/04
[52] U.S. Cl. ..................................... 420/472; 420/477
[58] Field of Search ............... 420/472, 473, 476, 477, 420/496, 499; 148/412, 413, 433, 434

[56] References Cited

FOREIGN PATENT DOCUMENTS 218701 12/1983 Japan .................................... 420/472
59-31839 2/1984 Japan .

OTHER PUBLICATIONS

Search Report filed on a corresponding application filed in Japan dated Dec. 8, 1987, Japan published application 50-147420, Nov. 26, 1975.

Primary Examiner—Melvyn J. Andrews
Assistant Examiner—George Wyszomierski
Attorney, Agent, or Firm—Oblon, Fisher, Spivak, McClelland & Maier

[57] ABSTRACT

A copper alloy excellent in migration resistance comprising from 0.05 to 0.20% by weight of Fe, from 0.02 to 0.05% by weight of P, from 1.0 to 5.0% by weight of Zn, less than 2.5% by weight of Sn and the substantial balance of Cu and impurities. The copper alloy of this invention is excellent in migration resistance as comparable with brass and also excellent in stress corrosion crackings, as well as have higher strength than the copper alloy or the pure copper or the like.

2 Claims, No Drawings

COPPER ALLOY EXCELLENT IN MIGRATION RESISTANCE

BACKGROUND OF THE INVENTION

Field of the Invention

This invention concerns a copper alloy excellent in migration resistance and, more specifically, it relates to a copper alloy excellent in migration resistance suitably used as material for electric and electronic components such as semiconductor parts, mechanical components, for examples, switching parts, bus bars, terminals and connectors, as well as printed circuit boards. As the material for the mechanical components such as terminals and connectors for use in home and industrial fields or in automobiles, brass has generally been used and phosphor bronze has been used in a case where reliability is particularly demanded.

However, brass involves the problem of stress corrosion crackings, while phosphor bronze may possibly cause migration under the conditions where condensation of moisture occurs.

Pure copper and Cu-Fe-P type alloys (CDA11000, CDA12200, CDA19200, CDA19210, and CDA19400) have often been used as the materials for electronic and electrical components for use in lead frames of semiconductor components and printed circuit boards.

Reduction in the size and the increase in the mounting density have rapidly been developed for the components constituted with the materials applied to the foregoing application uses due to the technical progress in recent years. In the electric or electronic components for use in home electric products such as coolers, television receivers and video tape recorders, as well as those mounted on automobiles, development has been made for the increase in the mounting density and the multilayered structure of printed circuit boards, as well as reduction in the inter-electrode distance. In addition, improvement in the current capacity has also been attempted on one hand.

As a result, printed circuits or electrode portions are liable to suffer from the effects of condensated moistures or dusts (liable to absorb water) and electric fields, by which electrochemical migration occurs to reduce the insulation performance in conventional materials making it difficult to reduce the size and increase the mounting density.

Migration means herein such a phenomenon that metal elements are ionized upon condensation of moisture between electrodes, the ionized metal elements transfer to the cathode by means of a coulomb force and metal crystals are grown in a dendritic manner from the cathode and reach as far as the anode in the same manner as electroplating, to cause short circuitting between them.

Oxides are often formed to the inside and the surface of metal crystals depending on the circumstances such as drying or dewing, wherein substances between the electrodes are extended in the form of an extremely thin film along the surface of insulators such as plastic, glass and ceramic and often branched into plurality parts at the top end. This phenomenon occurs under the application of several to several tens of voltage and of several to several tens ampere of current. Although this has generally been considered to occur in silver, it has been found that such a phenomenon also possibly occur in copper and copper alloys with the recent development in the higher density mounting and increase in the number of constituent layers in printed circuit boards for electric or electronic components.

This migration problem occurs not only in the case of flooding due to moisture condensation but also occurs in the case where water is deposited to electric and electronic components caused by water leakage or the like and the advent of migration-resistant material has been demanded.

OBJECT OF THE INVENTION

This invention has been achieved in view of the foregoing various problems in the prior art and it is an object thereof to provide a copper alloy excellent in migration resistance that can suppress the growing of electrically deposited substances thereby causing less migration even when moisture condensation is resulted because of the reduced insulating distance between wiring circuits and of the reduced inter-electrode distance as from 1/10 inch to 1/30 or 1/40 inch caused by the size reduction and the increase in the mounting density of mechanical components for use in switching parts, bus bars, terminals and connectors, as well as printed wiring boards and semiconductor components, and further, having electroconductivity of greater than 30% IACS so as to satisfy the purpose of increasing the current capacity and improved mechanical properties than those of the pure copper and phosphorus deoxidized copper, with tensile strength of more than 30 kgf/mm$^2$.

SUMMARY OF THE INVENTION

The foregoing objects can be attained by a copper alloy excellent in migration resistance according to this invention, which comprises from 0.05 to 0.20% by weight of Fe, from 0.02 to 0.05% by weight of P, from 1.0 to 5.0% by weight of Zn, less than 2.5% by weight of Sn and the substantial balance of Cu.

For the particular application use where tensile strength of greater than 50 kgf/mm$^2$ is required, the copper alloy according to this invention disirably comprises from 0.05 to 0.15% by weight of Fe, from 0.02 to 0.05% by weight of P, from 1.0 to 5.0% by weight of Zn, from 1.0 to 2.5% by weight of Sn and the substantial balance of Cu.

Furthermore, for the particular application use where electrical conductivity of higher than 60% IACS is required, the copper alloy according to this invention desirably comprises from 0.05 to 0.20% by weight of Fe, from 0.025 to 0.50% by weight of P, from 1.1 to 3.5% by weight of Zn, less than 0.1% by weight of Sn and the substantial balance of Cu.

The copper alloy excellent in migration resistance according to this invention will now be described more specifically.

Description will at first be made for the components and the ratio of the components contained in the copper alloy excellent in migration resistance according to this invention.

Fe and P when contained together form iron phosphide in the matrix phase to improve the spring limit value and contribute to the reinforcement of elevated temperature creep characteristics. If the Fe content is less than 0.05% by weight, excess P content not contributing to the formation of iron phosphide leaves the solid-solution element in the matrix phase to reduce the electrical conductivity thereby providing less effect for improving the spring limit value even if P is contained by from 0.02 to 0.050% by weight. While on the other hand, if the Fe content exceeds 0.20% by weight, excess Fe content not contributing to the formation of iron phosphide leaves the solid-solution element in the matrix phase to reduce the electrical conductivity if P is contained by 0.050% by weight. Accordingly, the Fe content is defined as from 0.05 to 0.20% by weight. Desirably, the upper limit of the Fe content is 0.15% by weight. Particularly, in the case of improving the strength and the spring limit value by the addition of Sn, the Fe content is desirably from 0.05 to 0.15% by weight.

In the same manner, if the P content is less than 0.02% by weight, no improvement in the spring limit value and in the elevated temperature creep characteristics are expected and Fe not contributing to the formation of iron phosphide leaves the solid-solution element in the matrix to reduce the electrical conductivity if Fe is contained by from 0.05 to 0.20% by weight. Further, if the P content exceeds 0.050% by weight, the cast ingot prepared by usual semi-continuous casting can not withstand hot rolling fabrication. Accordingly, the P content is defined as from 0.02 to 0.050% by weight. In the case of adding P with an aim of maintaining the electrical conductivity and improving the strength, it is preferably contained by from 0.025 to 0.050% by weight.

Zn is an essential element which is ionized upon water intrusion or moisture condensation thereby decreasing the content of Cu ions and thus suppressing the migration. If the content is less than 1.0% by weight, no substantial effect is obtained, whereas if it exceeds 5.0% by weight, the electrical conductivity is reduced along with the increase in the content and the satisfactory conductivity of greater than 30% IACS, as the material for use in electronic components can not be obtained due to the reduction in the conductivity along with the increase in the Zn content, although the effect of suppressing the migration and thereby lowering the leak current can be obtained. Further, it tends to cause stress corrosion cracking. Accordingly, the Zn content is defined as from 1.0 to 5.0% by weight. Particularly, in the case where the electrical conductivity is made greater than 60% IACS, the Zn content is desirably from 1.1 to 3.5% by weight.

Sn is a solid-solution element in Cu thereby improving the strength and the spring limit value. It can be added up to 2.5% by weight thereby providing a tensile strength of greater than 30 Kgf/mm$^2$. However, if it exceeds 2.5% by weight, the electrical conductivity is reduced failing to satisfy the electrical conductivity of higher than 30% IACS. In the case of maintaining the tensile strength of greater than 50 kgf/mm$^2$, it is desired to add Sn by more than 1.0% by weight. Further, in the case of maintaining the electrical conductivity to higher than 60% IACS, it is desired to keep the Sn content less than 0.1% by weight.

In addition to the essential elements Fe, P, Zn and Sn as described above, one or more of Be, B, Mg, Al, Si, Ti, Cr, Mn, Ni, Co, Zr, Ag, In and Sb may also be incorporated and they can satisfy the tensile strength of greater than 30 kgf/mm$^2$ and the electroconductivity of higher than 30% IACS so long as the content of the abovemention elements is less than 0.1% by weight. Further, other properties are not damaged, when the content of the above-mentioned elements within the specified range is allowed.

This invention will now be described more specifically referring to examples.

EXAMPLE 1

Alloys of the compositions shown in Table 1 were melted in an electric furnace under an air atmosphere while being covered with charcoal, cast into an inclined casting type book mold made of cast iron to obtain cast ingots of 60 mm thickness, 60 mm width and 180 mm length.

The surface and the rear face of these cast ingots were scalped each by 2.5 mm and hot rolling was applied for the brass alloys at 740° C. and for those materials other than brass at 850° C. to obtain strip materials of 10 mm thickness. Those other than brass were reheated to 800° C. and then quenched in water.

After removing the oxide scales from the surface of hot rolled materials with 20 vol % aqueous solution of sulfuric acid, they were cold rolled into 0.64 mm thickness. Annealing was applied to the brass alloys at 430° C.×2 hr and to those materials other than brass at 500° C.×2 hr. After removing oxide scales with 20 vol % of aqueous solution of sulfuric acid, they were cold rolled into 0.32 mm thickness. Further, alloys No. 1–No. 9 were annealed in a niter bath furnace at 375° C. for 20 sec and alloy No. 10 was annealed at 325° C. for 20 sec. and, thereafter, the surface oxide scales were removed with 20 vol % of aqueous solution of sulfuric acid. The alloy No. 11 is usually used in the form of rolled material as it is.

TABLE 1

| | No. | Sn | Fe | P | Zn | Cu | Remarks |
|---|---|---|---|---|---|---|---|
| | | | | Chemical ingredient (wt %) | | | |
| Alloy of the invention | 1 | 0.5 | 0.15 | 0.048 | 2.5 | balance | |
| | 2 | 1.0 | 0.12 | 0.035 | 3.4 | balance | |
| | 3 | 1.5 | 0.08 | 0.029 | 4.5 | balance | |
| | 4 | 2.1 | 0.11 | 0.032 | 1.1 | balance | |
| | 5 | 2.1 | 0.11 | 0.034 | 1.5 | balance | |
| | 6 | 2.0 | 0.10 | 0.030 | 2.0 | balance | |
| | 7 | 2.1 | 0.10 | 0.033 | 3.8 | balance | |
| Comparative Alloy | 8 | 1.9 | 0.11 | 0.032 | 0.5 | balance | Cu—Fe—P—Sn alloy with low Zn content |
| | 9 | 2.3 | 0.10 | 0.036 | 5.3 | balance | Cu—Fe—P—Sn alloy with high Zn content |
| | 10 | 4.0 | — | 0.04 | — | balance | phosphor bronze |
| | 11 | — | — | — | balance | 69.0 | 7/3 brass |

Migration Resistance Test

A pair of two specimen sheets were prepared from strip materials shown in Table 1 into 0.32 mm thickness, 3.0 mm width and 80 mm length to obtain test specimens.

For the migration resistance, the maximum leak current upon applying a DC voltage at 14V was used as the judging criterion.

An ABS resin layer of 1 mm thickness formed with a discharge hole of 10 mm diameter was put between the two sheet-like test specimens. Retainer plates were disposed to the respective ends of the specimens and they were secured from above by means of clips. Then, conductive wires were connected to the respective ends of the two test specimens and these two wires were further connected to cathode and anode terminals of a battery so as to serve one of the specimens as an anode plate and the other of them as a cathode plate.

To the test specimens put under the foregoing state, drying/wetting test of immersing them in tap water for 5 minutes while applying DC voltage at 14V and then drying for 10 minutes was applied. The maximum leak current up to 50 cycles was measured with a high sensitive recorder. The results are shown in Table 2.

ing the rate as the bending tendency from the following equation:

$$\text{Stress Relaxation Rate} = \frac{I_1 - I_2}{I_1 - I_0} \times 100$$

(smaller value is better for the stress relaxation) where
  $I_0$: length of the jig (mm)
  $I_1$: length of the specimen at the start (mm)
  $I_2$: horizontal distance between the ends of the specimen after the elapse of 500 hrs.

Test results are shown in Table 2. As shown in Table 2, any of the alloys of the exmaples according to this invention has tensile stress greater than 30 kgf/mm$^2$ and is excellent in the spring limit value and the stress corrosion rate, in which the tensile strength can be increased to greater than 50 kgf/mm$^2$ by the addition of more than 1% by weight of Sn.

TABLE 2

|  | No. | Tensile strength (kgf/mm$^2$) | Elongation (%) | Spring limit value Kb 0.1 (kgf/mm$^2$) | Electrical conductivity (% IACS) | Maximum leak current (Amp) | 150° C. stress relaxation (%) |
|---|---|---|---|---|---|---|---|
| Alloy of the invention | 1 | 51.0 | 7 | 42.1 | 51 | 0.55 | 13 |
|  | 2 | 55.4 | 9 | 50.2 | 39 | 0.56 | 12 |
|  | 3 | 58.3 | 8 | 51.2 | 34 | 0.54 | 13 |
|  | 4 | 59.5 | 9 | 53.1 | 33.8 | 0.62 | 14 |
|  | 5 | 59.6 | 9 | 53.1 | 33.3 | 0.58 | 14 |
|  | 6 | 59.8 | 9 | 53.2 | 32.9 | 0.55 | 13 |
|  | 7 | 60.1 | 10 | 53.4 | 31.2 | 0.54 | 14 |
| Comparative alloy | 8 | 59.6 | 9 | 52.8 | 34.6 | 1.45 | 14 |
|  | 9 | 60.3 | 10 | 53.3 | 27.1 | 0.53 | 13 |
|  | 10 | 66.5 | 14 | 57.1 | 22.5 | 4.14 | 16 |
|  | 11 | 62.7 | 3 | 30.1 | 28.1 | 0.55 | 60 |

As can be seen from Table 2, the alloys (No. 1-No. 7) of the examples according to this invention show leak current from 0.5 to 0.6 ampere which are comparable with brass No. 11 and superior to phosphor bronze No. 10 that shows 4 ampere of leak current.

Further, although alloys No. 8 and No. 9 shown as the comparative alloys contain Zn less than 1% and more than 5%, it has been demonstrated that the former has no sufficient improvement in the leak current value, while the latter is inferior to brass in electrica conductivity.

Although DC 14V used for automobile was applied for measurement of the leak current in this embodiment, the terminal connector made of the copper alloy according to this invention is also usable in an AC circuit working at usual 100V-120V. While conventional phosphor bronze often causes migration and electric discharge in the state where the moisture is condensated, the alloy according to this invention is most suitable not only for automobiles but also for home and industrial application uses.

Stress Relaxation Rate

In the same manner as described for the migration resitance test, test specimens according to JIS 13 No. B in which the longitudinal direction of the test specimen was aligned in parallel with the rolling direction were prepared and then the tensile strength was measured. Further, the spring limit value was tested according to JIS H3130.

The stress relaxation rate was determined by bending the specimen in a U-shaped configuration such that the stress at the middle portion was 80% of the offset yield stress and maintaining at 150° C. for 500 hr and calculat-

Electrical conductivity

The electrical conductivity of the specimens was measured according to JIS H0505 while aligning the longitudinal direction of the specimens in parallel with the rolling direction. The results are shown in Table 2. As shown in Table 2, any of the alloys of the examples according to this invention shows electrical conductivity of higher than 30% IACS and it can be seen that any of the alloys according to this invention is excellent as compared with Comparative Examples.

In addition, the alloy according to this invention exhibits no stress corrosion cracking and shows migration resistance comparable with that of brass.

EXAMPLE 2

Then, explanation will be made for other examples of the copper alloy according to this invention which are excellent in the migration resistance and have electrical conductivity of higher than 60% IACS.

Copper alloys containing components in the ratio shown in Table 3 were melted in an electric furnace under atmospheric air while being covered with charcoal and cast into an inclination pouring type book mold made of cast iron to prepare cast ingots 60 mm thickness, 60 mm width and 180 mm length.

The surface and the rear face of these cast ingots were scalped each by 2.5 mm and hot rolling was applied at 740° C. to brass alloys and at 850° C. to other alloys than brass to prepare strip material of 10 mm thickness. Those materials other than brass were reheated to a temperature of 800° C. and then quenched in water.

After removing the oxide scales from the surface of these hot rolled materials, they were cold-rolled to a thickness of 1.11 mm. Then, annealing was applied at 430° C.×2 hr for brass, at 450° C.×2 hr for alloy No. 7 and at 500° C.×2 hr for other alloys. After pickling to remove the scales, they were rolled into 1.0 mm thickness.

A pair of two test specimens each with 1.00 mm thickness, 3.00 mm width and 60 mm length were prepared from such strip materials and the electrical conductivity was measured for specimens while spacing apart the specimens by a distance of 1.0 mm. The drying/wetting test of immersing for 10 minutes in water while applying 14V voltage and drying for 10 minutes was repeatedly conducted according to the tap water immersion test to measure the maximum leak current up to 100 cycles thereby estimating the migration property. The current was measured in the same manner as in Example 1 by a high sensitive recorder.

The tensile strength and the elongation were measured for the test specimens according to JIS No. 5 while aligning the longitudinal direction of the specimen in parallel with the rolling direction.

The results are shown in Table 4.

comparative alloys Nos. 1, 2, 5 and 7 have high electrical conductivity of greater than 60% IACS, alloys Nos. 5 and 7 with no Zn content shows large maximum leak current and alloy No. 12 with less Zn content shows a leak current somewhat greater as compared with No. 6, in which some depletion results to the test piece upon migration evaluation test and the insulation performance is not sufficient.

Further, the alloy according to this invention is superior to the pure copper No. 7 also in the balance between the tensile strength and the elongation.

Further, although the 7/3 brass No. 6 shows less leak current and causes less migration, the electrical conductivity is as low as 28% IACS and thus undergoes a limit for the reduction in the size and increase in the mounting density.

Although the foregoing facts have been shown by the application of DC voltage, leaching of Cu ions upon moisture condensation also occurs under AC current and it is also considered that electrically deposited products and oxides thereof may reduce the insulating performance of plastic, glass and ceramic. However, such an undesired phenomenon can be solved by the highly electrical conductive copper alloy excellent in

TABLE 3

|  | No. | Fe | P | Zn | Sn | Cu | Remarks |
|---|---|---|---|---|---|---|---|
| Comparative alloy | 1 | 0.11 | 0.03 | 0.5 | — | balance | Cu—Fe—P alloy with low Zn content |
|  | 2 | 0.12 | 0.04 | 0.9 | 0.01 | balance |  |
| Alloy of the invention | 3 | 0.09 | 0.03 | 1.4 | — | balance |  |
|  | 4 | 0.10 | 0.03 | 3.0 | 0.05 | balance |  |
| Comparative alloy | 5 | 0.10 | 0.03 | — | 0.05 | balance | Cu—Fe—P alloy with no Zn content |
|  | 6 | — | — | balance | — | 69 | 7/3 brass |
|  | 7 | — | — | — | — | 99.98 | pure copper |

Chemical ingredient (wt %)

TABLE 4

|  | No. | Electrical conductivity (% IACS) | Maximum leak current (A) | Appearance of the anode piece after 100 cycle | Tensile strength (kgf/mm$^2$) | Elongation (%) | Remarks |
|---|---|---|---|---|---|---|---|
| Comparative alloy | 1 | 82 | 0.45 | 10% depletion in the lateral direction of plate at the middle portion | 31.7 | 30.4 | Cu—Fe—P alloy with low An content |
|  | 2 | 77 | 0.42 | 5% depletion in the lateral direction of plate at the middle portion | 31.6 | 30.0 |  |
| Alloy of the invention | 3 | 73 | 0.35 | with no depletion | 32.6 | 32.1 |  |
|  | 4 | 65 | 0.31 | with no depletion | 33.0 | 28.1 |  |
| Comparative alloy | 5 | 92 | 1.10 | 50% depletion in the lateral direction of plate at the middle portion | 31.5 | 30.4 | Cu—Fe—P alloy with no Zn content |
|  | 6 | 28 | 0.34 | 10% depletion in the lateral direction of plate at the middle portion | 44.5 | 37.7 | 7/3 brass |
|  | 7 | 97 | 1.21 | depletion all over the lateral direction of plate the middle portion | 26.7 | 31.0 | pure copper |

From Table 4, the following descriptions will be apparent.

Both of highly electrical conductive copper alloys No. 3 and No. 4 excellent in the migration resistance according to this invention have electrical conductivity of higher than 60% IACS, and a leak current value comparable with that in No. 6:7/3 brass. It is shown that the migration and the leak current are in a proportional relationship and that there is less reduction in the insulation performance due to migration as compared with the conventional material even if the distance between circuits is brought closer along with the increase in the density of the printed circuits or increase in the number of constituent layers. On the other hand, although the the migration resistance and with electrical conductivity of higher than 60% IACS according to this invention.

As has been described above, the copper alloy excellent in the migration resistance according to this invention has electrical conductivity of higher than 30% IACS and tensile strength of greater than 30 kgf/mm$^2$ which are required for semiconductor parts, mechanical parts such as bus bars, terminals and connectors, as well as for the materials of electronic and electric components for use in printed circuit boards etc. and can be applied as the material having a migration resistance, strength and stress corrosion cracking comparable with those of brass, and also as the material having a higher strength and greater migration resistance than those in pure copper and phosphorus deoxidized copper.

What is claimed is:

1. A copper alloy excellent in migration resistance and spring limit property consisting essentially of from 0.05 to 0.15% by weight of Fe, from 0.02 to 0.05% by weight of P, from 1.1 to 4.5% by weight of Zn, from 1.0 to 2.5% by weight of Sn and the substantial balance of Cu and impurities.

2. A copper alloy excellent in migration resistance and electrical conductivity consisting essentially of from 0.05 to 0.20% by weight of Fe, from 0.025 to 0.050% by weight of P, from 1.1 to 3.5% by weight of Zn, less than 0.1% by weight of Sn and the substantial balance of Cu and impurities.

* * * * *